(12) United States Patent
Kurikawa et al.

(10) Patent No.: US 7,851,108 B2
(45) Date of Patent: Dec. 14, 2010

(54) MASK BLANK GLASS SUBSTRATE MANUFACTURING METHOD, MASK BLANK MANUFACTURING METHOD, MASK MANUFACTURING METHOD, MASK BLANK GLASS SUBSTRATE, MASK BLANK, AND MASK

(75) Inventors: Akinori Kurikawa, Kofu (JP); Hisashi Kasahara, Hokuto (JP); Yasushi Okubo, Higashiyamato (JP)

(73) Assignee: Hoya Corporation, Tokyo (JP)

(*) Notice: Subject to any disclaimer, the term of this patent is extended or adjusted under 35 U.S.C. 154(b) by 992 days.

(21) Appl. No.: 11/391,332

(22) Filed: Mar. 29, 2006

(65) Prior Publication Data

US 2006/0246361 A1    Nov. 2, 2006

(30) Foreign Application Priority Data

Mar. 30, 2005 (JP) .............................. 2005-96976
Dec. 28, 2005 (JP) ............................ 2005-377140

(51) Int. Cl.
G03F 1/00 (2006.01)
G03F 1/14 (2006.01)

(52) U.S. Cl. ............................................. 430/5; 430/4
(58) Field of Classification Search .................. 430/4–5
See application file for complete search history.

(56) References Cited

U.S. PATENT DOCUMENTS

| | | | | |
|---|---|---|---|---|
| 4,606,747 A | * | 8/1986 | Steinhoff | 65/102 |
| 2002/0081501 A1 | * | 6/2002 | Hasegawa et al. | 430/5 |
| 2003/0165747 A1 | * | 9/2003 | Magg | 430/5 |
| 2004/0221876 A1 | * | 11/2004 | Waleh et al. | 134/2 |
| 2005/0264805 A1 | * | 12/2005 | Cromwell et al. | 356/246 |
| 2006/0234139 A1 | * | 10/2006 | Watson et al. | 430/5 |

FOREIGN PATENT DOCUMENTS

| | | |
|---|---|---|
| JP | 59-15938 A | 1/1984 |
| JP | S6080450 U1 | 6/1985 |
| JP | S6241145 A | 8/1994 |
| JP | H11132958 A | 5/1999 |
| JP | H11190699 A | 7/1999 |
| JP | H11190700 A | 7/1999 |
| JP | 2002-116533 A | 4/2002 |
| JP | 3422935 B2 | 4/2003 |

OTHER PUBLICATIONS

Japanese Office Action corresponding to Japanese Patent Application No. 2005-377140, dated Sep. 8, 2010.

* cited by examiner

*Primary Examiner*—Stephen Rosasco
*Assistant Examiner*—John Ruggles
(74) *Attorney, Agent, or Firm*—Sughrue Mion, PLLC

(57) ABSTRACT

A method of manufacturing a mask blank glass substrate or mask blank that includes a mark forming step, and a mask blank glass substrate or mask blank that includes a mark. The mark is a pit formed by irradiating laser light onto a mirror-like surface in an area, having no influence on transfer, on a surface of the mask blank glass substrate. The pit is used as a marker for individually identifying or managing the mask blank glass substrate. The marker may be correlated with information including at least one of substrate information about the mask blank glass substrate, thin film information about the mask pattern thin film, and resist film information about the resist film. A mask blank glass substrate with marker correlated to at least one of the resist film information and thin film information may be used to manufacture a new mask blank.

23 Claims, 4 Drawing Sheets

MASK BLANK GLASS SUBSTRATE MANUFACTURING METHOD, MASK BLANK MANUFACTURING METHOD, MASK MANUFACTURING METHOD, MASK BLANK GLASS SUBSTRATE, MASK BLANK, AND MASK

This application claims priority to prior Japanese patent applications JP 2005-96976 and JP 2005-377140, the disclosures of which are incorporated herein by reference.

BACKGROUND OF THE INVENTION

This invention relates to a mask blank glass substrate manufacturing method, a mask blank manufacturing method, a mask manufacturing method, a mask blank glass substrate, a mask blank, and a mask.

Conventionally, a mask blank, in which an optically readable area code is provided in the form of a metal film formed on an end surface or a back surface of a glass substrate, is known. (see, e.g. Japanese Unexamined Patent Application Publication (JP-A) No. 2002-116533). Further, a mask blank, in which predetermined symbols are marked on a side surface (end surface) of a glass substrate at its frosted portion, is also known (see, e.g. Japanese Unexamined Patent Application Publication (JP-A) No. S59-15938).

In recent years, the wavelength of an exposure light source has been reduced to 200 nm or less. Therefore, the quality (e.g. the allowable size of a defect, the allowable number of defects, or the in-plane thickness uniformity of a resist film that affects pattern characteristics of a device) required for a mask blank glass substrate or a mask blank has been becoming higher and higher. Depending on the manner of formation of an area code or the like, dust may be generated in a later process. Thus, it possibly becomes difficult to satisfy the required quality. Further, depending on the manner of formation of an area code or the like and the position of the formation thereof, the in-plane thickness uniformity of a resist film formed by the spin coating method may be degraded. Thus, it possibly becomes difficult to satisfy the required quality. Particularly, in the case of a thin resist film having a thickness of 300 nm or less for miniaturization of a pattern in recent years, the influence exerted on the pattern formation due to variation of in-plane thickness increases more than ever before and, therefore, the problem becomes more conspicuous. Further, also end surfaces are often mirror-polished in a mask blank glass substrate in recent years. Therefore, it is often difficult to obtain sufficient reading accuracy from clustered symbols or the like.

SUMMARY OF THE INVENTION

It is therefore an object of this invention to provide a mask blank glass substrate manufacturing method, a mask blank manufacturing method, a mask manufacturing method, a mask blank glass substrate, a mask blank, and a mask that can solve the foregoing problems.

For accomplishing the foregoing object, this invention has the following structures.

(Structure 1)

A method of manufacturing a mask blank glass substrate, comprising:

a marking step of irradiating laser light onto a mirror-like surface in an area, having no influence on transfer, on a surface of the mask blank glass substrate to thereby form a pit that is used as a marker for identifying or managing the mask blank glass substrate.

The marking step forms the mark, for example, in a peripheral area, having no influence on transfer, on a main surface, where a mask pattern thin film is not formed, of the glass substrate, on a side surface, having no influence on transfer, of the glass substrate, on a chamfered surface formed between the main surface and the side surface, at a notch mark of the glass substrate, or the like. The marking step forms the pit, for example, by melting or sublimating part of the mirror-like surface of the glass substrate by irradiation of the laser light. The marker thus formed ensures the sufficient reading accuracy and has no possibility of generating dust in a later step.

The marker can be used, for example, as identification information/identification symbols (identification code) or managing symbols (managing code) unique to the manufactured mask blank glass substrate.

This enables one-by-one management of mask blank glass substrates that cannot be achieved conventionally.

Further, this identification information can be correlated, for example, with information (substrate information: defect information, surface form information such as surface roughness or flatness, shape such as thickness or size, or the like) obtained in the manufacturing step or unique substrate information (material, component, composition, purity, birefringence, transmittance, or the like) possessed by the glass substrate. This makes it possible to reliably achieve correlation between the obtained or prepared information and the mask blank glass substrate.

In place of or in addition to the marker indicative of the identification information/identification symbols or the managing symbols, the marking step may form a marker directly representing the substrate information obtained in the manufacturing step, the unique substrate information possessed by the glass substrate, or the like. Also in this case, one-by-one management of mask blank glass substrates can be properly carried out.

As a material of the glass substrate, use can be made of, for example, a synthetic quartz glass or a $SiO_2$—$TiO_2$-based multicomponent glass. According to the material of the glass substrate, a selection is made of a wavelength of laser light for melting or sublimating part of the glass substrate by irradiation of the laser light to thereby form a pit. In the case of the foregoing material of the glass substrate, the marking step can form the marker, for example, by a laser marker using a carbon dioxide ($CO_2$) gas laser. The part of the surface of the glass substrate can be suitably melted or sublimated by properly adjusting the energy of the laser light and the pit formed by the melting or sublimation can be read with high accuracy. Further, it is also possible to suppress generation of cracks due to aged deterioration. It is also possible that the marking step forms a plurality of pits by irradiating the laser light a plurality of times onto each of positions that will be the pits. This can reduce variation in shape of the plurality of pits. Thus, the reading accuracy of the marker can be improved. The plurality of pits, for example, may form respective points of a two-dimensional code such as a data matrix or a QR code or may be a hidden code or a random number code for preventing a third party from understanding information of the marker.

Unless the selection is made of the proper wavelength of the laser light according to the material of the glass substrate, the portion where the laser light is irradiated is, for example, formed with a crack-like marker. In this case, the crack-like marker undesirably causes generation of dust.

Further, by forming the marker on the side surface of the glass substrate, on the end surface of the glass substrate such as the chamfered surface, or at the notch mark of the glass substrate, it can be prevented that a new defect or the like is generated on the main surface of the glass substrate or the mask pattern thin film formed on the main surface due to the formation of the marker. Further, since the marker can be deleted by end-surface polishing or the like, even when, for example, necessity occurs to change the marker, a new marker can be formed without reducing the thickness of the glass substrate.

The marking step is carried out, for example, before lapping/polishing the glass substrate such as at the time of receiving the glass substrate or after performing the lapping/polishing and a substrate inspection. The marking step may be carried out during each step of the lapping/polishing, for example, after lapping the glass substrate, after end-surface polishing the glass substrate, or after mirror-polishing the main surfaces of the glass substrate. When the marking step is carried out before the substrate inspection, for example, a marker indicative of identification information/identification symbols or managing symbols of the glass substrate is formed.

Further, for example, when precise polishing and ultra-precise polishing are carried out in the end-surface polishing of the glass substrate, the marking step may be carried out between the precise polishing and the ultra-precise polishing with respect to the end surfaces. This can reduce the surface roughness of the inside of the marker and the end surface other than the marker and thus is more effective for preventing generation of dust. The precise polishing is, for example, polishing that is carried out by the use of a polishing solution containing cerium oxide and a solvent such as water and a polishing brush or a polishing pad. The ultra-precise polishing is, for example, polishing that is carried out by the use of a polishing solution containing colloidal silica and a solvent such as water and a polishing brush or a polishing pad. The marking step may be carried out, for example, on the main surface of the glass substrate between precise polishing and ultra-precise polishing. In this case, since the ultra-precise polishing of the main surface is carried out after the formation of the marker, it is possible to further reduce a possibility that the marker causes generation of dust.

(Structure 2)

A method according to Structure 1, further comprising:

a step of preparing substrate information about the mask blank glass substrate, wherein the substrate information is is correlated with the marker.

This makes it possible to directly correlate the substrate information such as information about surface shape, flatness, and defect of the glass substrate with the glass substrate.

The preparation of the substrate information about the glass substrate represents preparation of substrate information obtained in the manufacturing steps or unique substrate information possessed by individual glass substrates. For example, the substrate information obtained in the manufacturing steps includes substrate information obtained in a substrate inspection step.

The substrate inspection step checks, for example, the thickness, the surface shape (the warp shape of the main surface or the convex-concave state of the entire main surface), the flatness, the degree of parallelization, and so on with respect to the shape of the main surface of the glass substrate. This makes it possible to efficiently carry out, for example, a film forming step of forming a mask pattern thin film (e.g. phase shift film, light-shielding film, or the like) in manufacturing a mask blank.

Further, the substrate inspection step checks, for example, the position, kind (convex defect (particles or the like), concave defect (pinholes, cracks, or the like) or the like), and size with respect to the defect of the main surface of the glass substrate. If such defect data is known, for example, a mask pattern can be designed so as to avoid the defect upon manufacturing a mask.

(Structure 3)

A method according to Structure 2, wherein:

the substrate information is information including at least one of physical properties, chemical properties, optical properties, a surface form, a surface shape, a material, and a defect of the mask blank glass substrate.

As the physical properties of the glass substrate, there is cited, for example, birefringence, refractive index absorption coefficient, or the like. As the chemical properties of the glass substrate, there is cited acid resistance, alkali resistance, or the like. As the optical properties of the glass substrate, there is cited absorption coefficient, transmittance, or the like. As the surface form of the glass substrate, there is cited surface roughness, waviness, flatness, degree of parallelization, convex shape, concave shape, or the like. As the shape of the glass substrate, there is cited thickness, size, or the like. As the material of the glass substrate, there is cited glass type, composition, or the like. As the defect of the glass substrate, there is cited a defect inside the substrate such as striae, bubbles, or abnormality in transmittance due to the incorporation of impurities, a defect on the surfaces of the substrate such as particles, cracks, or pinholes, or the like. As described above, with respect to the defect of the glass substrate, by adding the information such as the position or size of the defect in the glass substrate in addition to the foregoing kinds of defects, it is possible, for example, to design a mask pattern so as to avoid the defect upon manufacturing a mask or to deal with it by applying the glass substrate to a mask blank with a grade in which the defect is not questioned or a mask blank adapted for use in a relatively long wavelength region.

(Structure 4)

A method of manufacturing a mask blank, comprising:

a film forming step of forming a mask pattern thin film on a main surface of the mask blank glass substrate obtained by the method according to Structure 1.

With respect to mask blanks, there are a plurality of grades with different qualities depending on exposure wavelengths or uses (formation patterns). The allowable size of a defect, the allowable number of defects, or the like differs depending on the grade. Further, there are a plurality of kinds of mask pattern thin films (phase shift film, light-shielding film (opaque film), and so on) and resist films that are formed in the manufacture of mask blanks. Therefore, it is not easy to manage the grades and the kinds of thin films and resist films to be formed, in the manufacture of mask blanks.

However, according to Structure 4, it becomes possible to perform one-by-one management of the mask blanks. Therefore, the grades and the kinds of thin films and resist films to be formed can be properly managed in the manufacture of the mask blanks. The marker represents, for example, identification information/identification symbols or managing symbols of the mask blank glass substrate. The identification information/identification symbols or the managing symbols are correlated, for example, with the kind of a mask blank to be formed by the mask blank glass substrate. Further, since the mask blanks can be reliably one-by-one managed, when, for example, supplying the information about the mask blanks to a mask maker or the like along with the mask blanks, it is possible to reliably carry out the correlation between the information and the mask blanks.

(Structure 5)

A method of manufacturing a mask blank, comprising:

a film forming step of forming a mask pattern thin film on a main surface of a glass substrate, and a marking step of irradiating laser light onto a mirror-like surface in an area, having no influence on transfer, on a surface of the glass substrate to thereby form a pit that is used as a marker for identifying or managing the glass substrate and/or a mask blank formed with the mask pattern thin film on the glass substrate.

According to Structure 5, it is possible to obtain the same effect as Structure 4. The marking step in Structure 5 may be carried out in the glass substrate manufacturing process as recited in Structure 1, but may be carried out before or after forming the mask pattern thin film after the glass substrate manufacturing process.

(Structure 6)

A method according to Structure 5, further comprising:

a step of preparing substrate information about the glass substrate before the film forming step, the marker being correlated with the substrate information, and a thin film determining step of determining the mask pattern thin film to be formed, based on the substrate information read from the marker, wherein the film forming step forms the mask pattern thin film determined in the thin film determining step.

This makes it possible to determine the kind of the mask pattern thin film to be formed in the film forming step, for example, depending upon the substrate information in the step of preparing the substrate information (specifically, the inspection results of the substrate inspection step (the substrate inspection step that inspects at least one of the surface shape, the flatness, and the defect of the main surface of the glass substrate). Therefore, the mask blank glass substrate can be effectively used without waste.

The thin film determining step, for example, identifies the surface shape of the main surface as the shape being one of the substrate information of the mask blank glass substrate. When a film stress exists in the mask pattern thin film, the surface shape, when the mask blank is formed, differs between the case where the surface shape of the main surface is concave and the case where it is convex. Thus, the thin film determining step determines the kind and thickness of the mask pattern thin film to be formed, taking into account the inspection results of the substrate inspection step. This makes it possible, for example, to improve the yield as compared with the case where the kind of a mask pattern thin film to be formed in the film forming step has been determined in advance, or the like.

(Structure 7)

A method according to Structure 5, further comprising:

a thin film information preparing step of preparing thin film information about the mask pattern thin film after the film forming step, wherein the marker is correlated with the thin film information obtained in the thin film information preparing step.

Specifically, the thin film information preparing step represents, for example, a thin film inspection step that inspects the thin film information, such as at least one of the optical properties, the surface shape, and the defect, of the mask pattern thin film. This makes it possible to directly correlate the thin film information of the mask pattern thin film such as the thin film information about the optical properties, the surface shape, the defect, or the like with the mask blank.

(Structure 8)

A method according to Structure 7, wherein:

the thin film information is information including at least one of physical properties, chemical properties, electrical properties, optical properties, a surface form, a material, a defect, and a film forming condition of the mask pattern thin film.

As the physical properties of the thin film, there is cited, for example, thermal expansion coefficient or the like. As the chemical properties of the thin film, there is cited acid resistance, alkali resistance, water resistance, or the like. As the electrical properties of the thin film, there is cited resistivity or the like. As the surface form of the thin film, there is cited surface roughness, waviness, flatness, degree of parallelization, convex shape, concave shape, or the like. As the material of the thin film, there is cited components, composition, composition distribution in a thickness direction or in-plane direction, or the like. As the defect of the thin film, there is cited a defect such as abnormality in transmittance due to the incorporation of impurities, particles, or pinholes. As the film forming conditions of the thin film, there are cited a film forming apparatus, kind of gas, gas pressure, sputtering target information, gas flow rate, heating condition, film forming date, and so on. Like the defects of the glass substrate as described above, by adding information such as the position or size of the defect in the thin film in addition to the foregoing kinds of defects, it is possible, for example, to design a mask pattern so as to avoid the defect in the manufacture of a mask or to deal with it by applying the thin film to a mask blank with a grade in which the defect is not questioned.

As a manner of using the thin film information, the following using manner is specifically considered. The marking step forms the marker for identifying the thickness of the mask blank glass substrate, the mask blank manufacturing method includes the thin film inspection step of inspecting, for example, at least one of the optical properties, the surface shape, and the defect being the thin film information of the mask pattern thin film, the thin film inspection step includes a pass/fail judging step of judging whether or not a specification of the mask blank is satisfied, the mask blank manufacturing method further includes a thin film stripping step of stripping the mask pattern thin film from the mask blank that has been judged not to satisfy the specification of the mask blank, a thickness identifying step of identifying, by the use of the information read from the marker, the thickness of the mask blank glass substrate that has been stripped of the mask pattern thin film in the thin film stripping step, and a repolishing step of polishing the main surface of the mask blank glass substrate by a polishing amount determined according to the thickness identified in the thickness identifying step, and the film forming step forms a new mask pattern thin film on the main surface of the mask blank glass substrate that has been polished In the repolishing step.

As a material of the mask blank glass substrate, for example, a synthetic quartz glass or a $SiO_2$—$TiO_2$-based multicomponent glass is used. Since such a glass is expensive, it is desirable that the glass substrate be effectively used without waste. According to the manner as described above, even when a failure in formation of the mask pattern thin film or the like occurs so that the specification of the mask blank is not satisfied, it is possible to efficiently recycle the mask blank glass substrate. By the use of the recycled mask blank glass substrate, a new mask blank can be properly manufactured. The mask blank glass substrate may be recycled as a mask blank glass substrate for a grade different from that before the recycling, such as a lower grade.

Further, according to the manner as described above, since the thickness of the glass substrate can be identified in the thickness identifying step, it is possible to simplify a thickness classification step before the repolishing. Moreover, according to the identified thickness, it is possible to easily and properly set the polishing conditions such as the polishing amount. The repolishing step, for example, sets a machining amount according to the thickness and carries out polishing by the polishing amount corresponding to the thickness. After the repolishing step, for example, a marker for identifying the mask blank glass substrate is formed after the recycling. It is noted here that the marker of the mask blank glass substrate before the recycling can be deleted, for example, by polishing in the repolishing step.

(Structure 9)

A mask blank manufacturing method according to Structure 5, further comprising:

a resist film forming step of forming a resist film on the mask pattern thin film after the film forming step, and a resist film information preparing step of preparing resist film information about the resist film, wherein the marker is correlated with the resist film information obtained in the resist film information preparing step.

According to Structure 9, it is possible to obtain the same effect as Structure 4. The resist film information preparing step specifically represents, for example, a resist film inspection step of inspecting the resist film.

(Structure 10)

A method according to Structure 9, wherein:

the resist film information is information including at least one of physical properties, chemical properties, a surface form, a material, a defect, and a film forming condition of the resist film.

As the physical properties of the resist film, there is cited, for example, hardness or the like. As the chemical properties of the resist film, there is cited acid resistance, base resistance, or the like. As the surface form of the resist film, there is cited surface roughness, waviness, flatness, in-plane thickness uniformity, average thickness, bird's-eye view of the resist film thickness, or the like. As the material of the resist film, there is cited resin material, molecular weight, kind of resist, or the like. As the defect of the resist film, there is cited convex defect such as particles, concave defect such as pinholes, or the like. With respect to the defect of the resist film, by adding information such as the position or size of the defect in the resist film in addition to the foregoing kinds of defects, it is possible, for example, to design a mask pattern so as to avoid the defect in the manufacture of a mask or to deal with it by applying the resist film to a mask blank with a grade in which the defect is not questioned. As the forming conditions of the resist film, there is cited a coating apparatus, spin coating condition, heating condition, heater, cooling condition, cooler, resist film forming date, resist film forming environment, or the like.

As a manner of using the resist film information, the following using manner is specifically considered. The marking step forms the marker for identifying a resist film to be formed on the mask pattern thin film, the mask blank manufacturing method includes the resist film forming step of forming the resist film on the mask pattern thin film and the resist film inspection step of inspecting, for example, at least one of the in-plane thickness uniformity and the defect being the resist film information of the formed resist film, the resist film inspection step including a pass/fail judging step of judging whether or not a specification of the mask blank is satisfied, and the mask blank manufacturing method further includes a resist film stripping step of stripping the resist film from the mask blank that has been judged not to satisfy the specification of the mask blank, a resist identifying step of identifying, by the use of the information read from the marker, the resist film to be formed on the mask pattern thin film on the glass substrate that has been stripped of the resist film in the resist film stripping step, and a resist film re-forming step of forming on the mask pattern thin film the resist film identified in the resist identifying step.

According to the manner as described above, even when, for example, a failure occurs in coating the resist film, it is possible to properly recoat/re-form a resist film. Further, since the resist film to be re-formed can be reliably selected, the management of the steps can be simplified.

(Structure 11)

A method of manufacturing a mask blank for obtaining a new mask blank by using a manufactured mask blank having a mask pattern thin film on a mask blank glass substrate and a resist film on the mask pattern thin film, wherein the mask blank glass substrate is formed, on a mirror-like surface in an area, having no influence on transfer, on a surface of the mask blank glass substrate, with a marker for identifying or managing the mask blank glass substrate and/or the mask blank, the marker being formed by irradiation of laser light, and the marker is correlated with information including at least one of substrate information about the mask blank glass substrate, thin film information about the mask pattern thin film, and resist film information about the resist film, the method comprising:

a film stripping step of stripping the resist film of the manufactured mask blank or the resist film and the mask pattern thin film of the manufactured mask blank;

a film re-forming step of forming a resist film other than the stripped film or a mask pattern thin film and a resist film other than the stripped films; and a step of obtaining at least one of resist film information about the resist film and thin film information about the mask pattern thin film formed in the film re-forming step, wherein at least one of the resist film information and the thin film information is correlated with the marker.

The film stripping step specifically represents, for example, a resist film stripping step or a thin film stripping step.

Further, a mask blank manufacturing method for manufacturing a new mask blank by the use of a manufactured mask blank having, on a mask blank glass substrate, a mask pattern thin film to be formed into a mask pattern, a resist film formed on the mask pattern thin film, and a marker for identifying the resist film, a marker for identifying the mask pattern thin film, or a marker for identifying the glass substrate, comprises a preparation step of preparing the manufactured mask blank, a resist film stripping step of stripping the resist film from the manufactured mask blank, a resist film selection step of selecting, by the use of information read from the marker, a resist film to be formed on the manufactured mask blank, and a resist film re-forming step of forming on the mask pattern thin film the resist film selected in the resist film selection step.

According to the manner as described above, even if a sensitivity change (degradation or the like) occurs in the resist film of the manufactured mask blank, the mask blank can be efficiently recycled. Further, since the marker is formed on the mask blank itself, it is possible to correlate between the information about the mask blank and the mask blank. This can simplify the management of the steps.

(Structure 12)

A mask blank manufacturing method according to Structure 11, wherein:

the marker has a pit shape formed by irradiating the laser light onto the mirror-like surface in the area, having no influence on transfer, on the surface of the mask blank glass substrate.

This makes it possible to form the marker with a very small possibility of generating dust.

(Structure 13)

A method according to Structure 11, wherein:

the resist film is a chemically amplified resist film, and a mask blank after the lapse of a predetermined time from coating of the resist film is prepared as the manufactured mask blank.

This makes it possible to properly recycle even the mask blank using the chemically amplified resist film that quickly changes in sensitivity. The chemically amplified resist film often largely changes in sensitivity in a short time, for example, about two weeks. If a mask is manufactured by the use of the mask blank formed with the resist film whose change in sensitivity is large, CD variation of a formed mask pattern undesirably becomes large. In the case of a normal resist film, a time period in which a change in sensitivity becomes large is, for example, about one month to three months.

(Structure 14)

A method of producing a mask, comprising:

a step of patterning the mask pattern thin film of the mask blank obtained by the method according to Structure 5 to thereby form a mask pattern on the mask blank glass substrate.

According to the Structure 14, the mask blank information is obtained via the marker so that one-by-one management can be reliably achieved throughout manufacture from the mask blank to the mask.

(Structure 15)

A mask blank glass substrate, comprising:

a pit on a mirror-like surface in an area, having no influence on transfer, on a surface of the mask blank glass substrate, the pit being formed by irradiation of laser light and used as a marker for identifying or managing the mask blank glass substrate and/or a mask blank formed with a mask pattern thin film on the mask blank glass substrate.

(Structure 16)

A mask blank glass substrate according to Structure 15, wherein:

the pit is formed in an area outside an optical path of inspection light, which checks at least a defect existing in a pattern forming area, on an end surface perpendicular to a main surface, where the mask pattern thin film is formed, of the mask blank glass substrate.

Since the pit is formed in the area outside the optical path of the inspection light, which checks at least a defect existing in the pattern forming area, on the end surface of the mask blank glass substrate, the pit does not obstruct the inspection light. Therefore, the mask blank glass substrate or the mask blank with a guarantee for the defective quality can be obtained.

(Structure 17)

A mask blank glass substrate, comprising:

a pit in an area a distance of 10 mm or less from a corresponding one of four corners of the mask blank glass substrate on an end surface perpendicular to a main surface, where a mask pattern thin film to become a transfer pattern is to be formed, of the mask blank glass substrate, while excluding an area a distance of 1.2mm from both sides of the main surface, the pit being formed by irradiation of laser light and used as a marker for identifying or managing the mask blank glass substrate and/or a mask blank formed with the mask pattern thin film on the mask blank glass substrate.

This makes it possible to obtain the same effect as Structure 1 or 15. Further, in case where a resist film is formed on the mask pattern thin film by the spin coating method, it is possible to prevent degradation of the in-plane thickness uniformity of the resist film caused by the pit formed on the end surface of the glass substrate.

(Structure 18)

A mask blank glass substrate according to Structure 15 or 17, wherein:

an opening width (L1) of the pit is 150 μm or more, a depth (D) of the pit is 10 μm or more, and a ratio (L1/D) between the opening width and the depth is 10 or more.

This makes it possible to ensure sufficient reading accuracy and, further, to suppress generation of dust because the inside of the pit can be easily cleaned by the use of a side brush or the like.

The surface roughness of the pit is preferably different from that of the mirror-like surface of the glass substrate and is, for example, preferably set in the range of 0.1 to 5 nm in Ra (arithmetic average surface roughness) and more preferably 0.1 to 2 nm. Arithmetic average surface roughness Ra follows Japanese Industrial Standard (JIS) B0601. The surface roughness of the pit is, specifically, a surface roughness of a bottom portion of the pit.

An annular convex portion may be formed at the periphery of an opening portion of the pit so as to surround the opening portion of the pit. With this structure, it is possible to enhance the reading accuracy of the marker. Therefore, for example, even when the depth of the pit is shallow, the marker can be read with sufficiently high accuracy. When the depth of the pit is shallow, a polishing amount required for deleting the marker is reduced. Accordingly, with this structure, when, for example, the mask blank glass substrate is recycled, the marker can be easily changed. It is preferable that the annular convex portion be formed so as to rise smoothly. The height of the convex portion is preferably set to 0.05 to 5 μm and more preferably 0.05 to 1 μm.

(Structure 19)

A mask blank glass substrate according to Structure 15 or 17, wherein:

the marker is correlated with substrate information about the mask blank glass substrate.

(Structure 20)

A mask blank, comprising:

the mask blank glass substrate according to Structure 15 or 17, and a mask pattern thin film to be formed into a mask pattern, the mask pattern thin film being formed on the mask blank glass substrate.

(Structure 21)

A mask blank according to Structure 20, wherein:

the marker is correlated with information including at least one of substrate information about the mask blank glass substrate, thin film information about the mask pattern thin film, and resist film information about a resist film formed on the mask pattern thin film.

(Structure 22)

A mask comprising:

the mask blank glass substrate according to Structure 15; and a mask pattern formed on the mask blank glass substrate.

According to this invention, a marker with a very small possibility of generating dust can be formed on a mask blank glass substrate, Further, it is possible to efficiently recycle a mask blank glass substrate or a mask blank. Further, a mask blank glass substrate or a mask blank with a guarantee for the defective quality can be obtained. Further, in the case of forming a resist film on a thin film for a mask pattern by the spin coating method, a mask blank glass substrate or a mask blank that prevents degradation of the in-plane thickness uniformity of the resist film caused by a marker formed on an end surface can be obtained.

BRIEF DESCRIPTION OF THE DRAWINGS

FIGS. 1A and 1B show one example of a structure of a mask blank according to a preferred embodiment of this invention, wherein FIG. 1A is a side view of the mask blank and FIG. 1B is a diagram showing one example of a structure of a marker;

DESCRIPTION OF THE PREFERRED EMBODIMENT

Now, a preferred embodiment according to this Invention will be described with reference to the drawings.

Figure 1A:
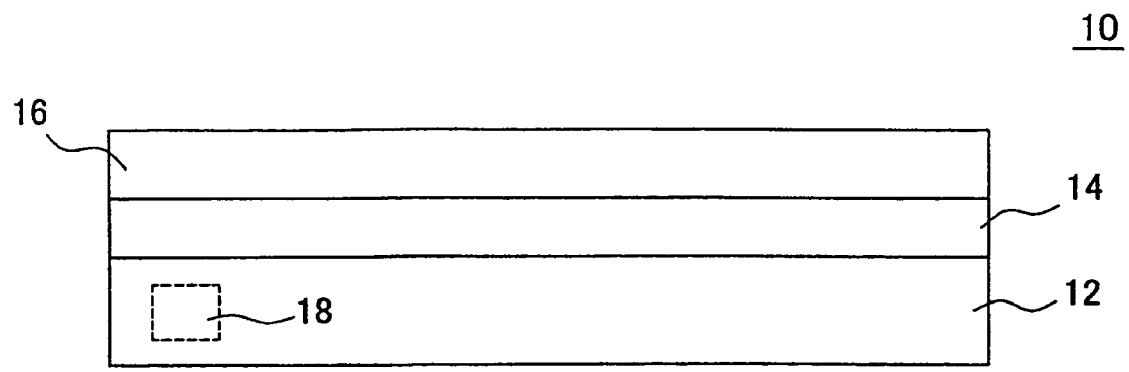
Figure 1B:
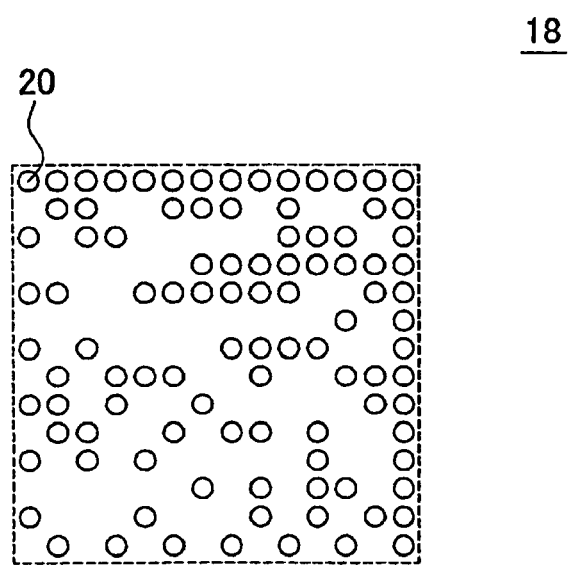

FIGS. 1A and 1B show one example of a structure of a mask blank 10 according to the embodiment of this invention. FIG. 1A is a side view of the mask blank 10. In this example, the mask blank 10 is a mask blank for an exposure light source with a wavelength of 200 nm or less, such as, for example, an ArF excimer laser (wavelength: 193 nm) or an $F_2$ excimer laser (wavelength: 157 nm), and comprises a glass substrate 12, a thin film 14 for a mask pattern, and a resist film 16.

The glass substrate 12 is a glass substrate for a mask blank and is made of a substrate material such as a synthetic quartz glass. The glass substrate 12 has main surfaces and end surfaces (side surfaces and chamfered surfaces) that are each polished to a predetermined surface roughness so as to be a mirror surface (e.g. arithmetic average surface roughness Ra is 1 nm or less). Further, in this example, the glass substrate 12 has, at a portion of the end surface, a marker 18 which is used for identification or management of the glass substrate 12. By the use of the marker 18, the glass substrate 12 or the mask blank 10 is one-by-one managed.

The mask pattern thin film 14 is a thin film such as a light-shielding film or a phase shift film. The mask pattern thin film 14 is patterned into a mask pattern in the manufacturing process of a mask. The resist film 16 is formed on the mask pattern thin film 14.

FIG. 1B shows one example of a structure of the marker 18. In this example, the marker 18 is a two-dimensional code and has a plurality of hollows or pits 20 forming respective points of the two-dimensional code. Each pit 20 is formed by melting or sublimating part of the end surface of the glass substrate 12 by irradiation of laser light.

In this example, the marker 18 represents identification information unique to the glass substrate 12. Further, this identification information is correlated with information, for example, about the surface shape, flatness, defect, and so on obtained in the manufacturing process of the mask blank 10.

Figure 2:
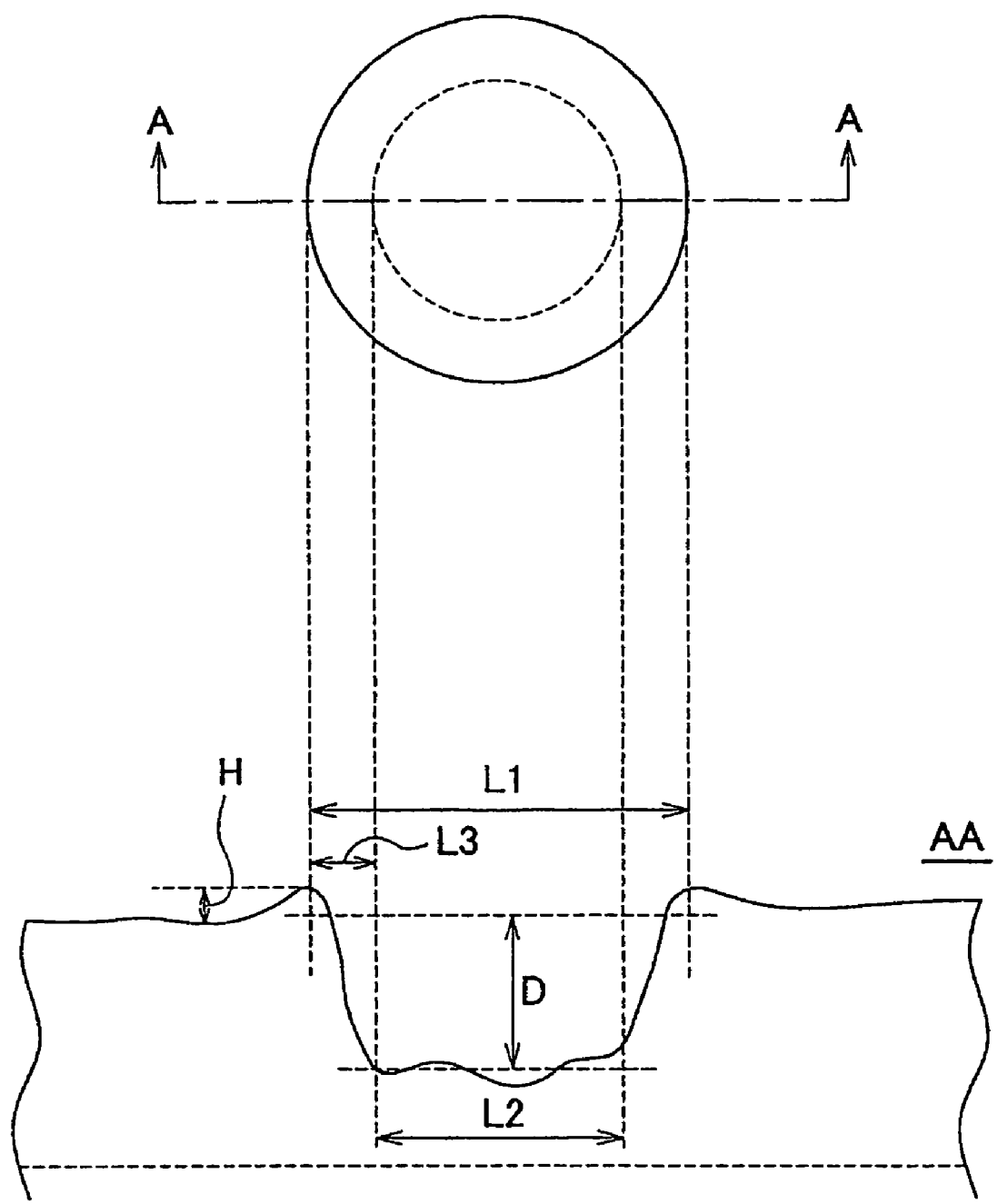
FIG. 2 is a diagram showing one example of a detailed shape of a pit of the marker.

FIG. 2 shows one example of a detailed shape of the pit 20. In this example, each pit 20 is a hole formed by a laser marker using a carbon dioxide ($CO_2$) gas laser. An opening portion of the pit 20 has a generally circular shape. Further, an annular convex portion is formed at the periphery of the opening portion of the pit 20 so as to smoothly rise from the end surface of the glass substrate 12 to a height H, thereby surrounding the opening portion of the pit 20. By forming the opening portion in this manner, it is possible to enhance the reading accuracy of the marker 18 (see FIGS. 1A and 1B). The opening portion of the pit 20 may have a polygonal shape such as a square shape or a polygonal shape with rounded corners.

Herein, an opening width L1 of the pit 20 is, for example, 100 to 500 μm and more preferably about 150 to 300 μm. A bottom width L2 of the pit 20 is, for example, 10 to 450 μm and more preferably about 30 to 250 μm. A width L3 of an inclined portion of the pit 20 is, for example, 5 to 75 μm and more preferably about 15 to 60 μm. A depth D of the pit 20 is, for example, 3 to 20 μm and more preferably about 5 to 15 μm. The height H of the rise of the opening portion of the pit 20 is, for example, 0.05 to 5 μm and more preferably about 0.05 to 1 μm. Further, the surface roughness of the pit 20 is, for example, 0.1 to 5 nm in Ra (arithmetic average surface roughness) and more preferably 0.1 to 2 nm.

In order to ensure the sufficient reading accuracy and, further, easily clean the inside of the pit 20 by the use of a side brush or the like to thereby suppress the generation of dust, it is preferable that the opening width L1 of the pit 20 be 150 μm or more, the depth D of the pit 20 be 10 μm or more, and the ratio (L1/D) between the opening width and the depth of the pit 20 be 10 or more.

The glass substrate 12 is subjected to a defect inspection for checking the presence of a convex defect (particles or the like), a concave defect (pinholes, cracks, or the like), striae, bubbles, abnormality in transmittance due to the incorporation of impurities, or the like at least in an area where the mask pattern is formed. For example, an inspection method as described in Japanese Patent No. 3422935 is carried out for checking the presence of the convex or concave defect on the surfaces of the glass substrate 12 or the presence of the striae or bubbles inside the glass substrate 12. In this inspection method, with respect to both main surfaces of the glass substrate 12 and at least the pair of side surfaces perpendicular to the main surfaces, inspection light (laser light) is introduced from the chamfered surface located between the main surface and the side surface under the condition that the inspection light propagates inside the glass substrate 12 while satisfying the total reflection condition, thereby checking the presence of the foregoing defect by detecting leaking light caused by leakage of the inspection light due to deviation from the total reflection condition owing to the convex or concave defect. On the other hand, in order to check the presence of the abnormality in transmittance due to the incorporation of impurities in the glass substrate 12, light having the exposure wavelength is introduced from the side surface of the glass substrate 12 and, by receiving light having a wavelength longer than the exposure wavelength, which is emitted from the internal defect of the glass substrate 12 due to the introduced light having the exposure wavelength, the internal defect is inspected based on the quantity of the received light. In either of the inspection methods as described above, the inspection light hits on the side surfaces of the glass substrate 12. Therefore, if the pits as the marker are formed on the side surface, where the inspection light is adapted to hit, of the glass substrate 12, the defect inspection cannot be carried out or, even if it can be carried out, the sufficient inspection accuracy cannot be obtained. Accordingly, the pits as the marker are preferably formed at a position in an area outside the optical path of the inspection light, which checks at least the defect existing in the pattern forming area, on the side surface being the end surface perpendicular to the main surface where the mask pattern thin film is formed. Specifically, in the glass substrate 12 having a size of 152.4 mm×152.4 mm×6.35 mm, it is preferable to form the pits as the marker at a position outside a center portion of 132 mm on the side surface of the glass substrate 12, i.e. in an area a distance of 10 mm or less from a corresponding one of four corners of the glass substrate 12.

It is more preferable to form the pits as the marker in the area of 10 mm or less from the corresponding one of the four corners of the glass substrate 12 while excluding an area of 1.2 mm from both sides of the main surface of the glass substrate 12. By forming the pits as the marker at the foregoing specified position, in the case of forming the resist film on the mask pattern thin film by the spin coating method, it is possible to prevent degradation of the in-plane thickness uniformity of the resist film on the mask pattern thin film.

Figure 3:
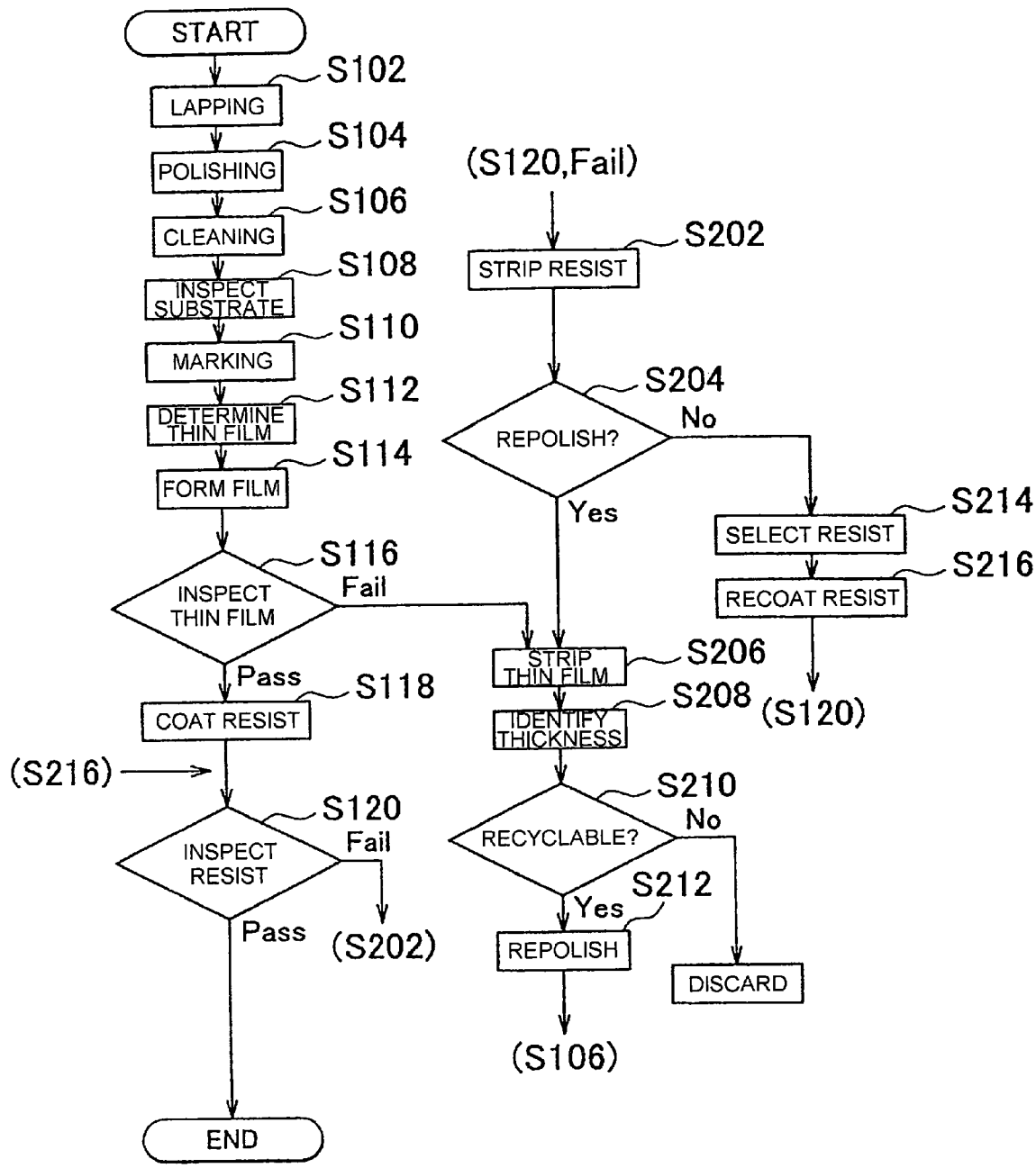
FIG. 3 is a flowchart showing one example of a manufacturing method of the mask blank.

FIG. 3 is a flowchart showing one example of a manufacturing method of the mask blank 10. Except what will be described hereinbelow, respective steps of the manufacturing method are the same as or similar to those in a known mask blank manufacturing method. In this example, at first, a glass substrate 12 with chamfered end surfaces is lapped by the use of a both-side lapping machine (lapping step S102).

Then, the end surfaces and the main surfaces of the glass substrate 12 are polished by the use of a both-side polishing machine (polishing step S104) and cleaning is carried out after the polishing (cleaning step S106). In the polishing step S104, the end surfaces and the main surfaces of the glass substrate 12 are subjected; for example, to rough polishing, precise polishing, and ultra-precise polishing so as to be finished to mirror surfaces each having, for example, a surface roughness of 0.2 nm or less in RMS (root mean square roughness).

Then, a substrate inspection is carried out to obtain information about the surface shape, flatness, and defect of the glass substrate 12 (substrate inspection step S108). The substrate inspection step S108 checks, for example, the thickness, the flatness, the warp shape of the main surface (the convex-concave state of the entire main surface), and so on with respect to the surface shape of the glass substrate 12. Further, with respect to the defect of the glass substrate 12, the substrate inspection step S108 checks, for example, the position, kind, size, and so on of the defect. In this case, the size of the defect is distinguished, for example, among 0.2 μm or less, 0.2 to 0.5 μm, 0.5 to 1 μm, and 1 μm or more. By distinguishing the size of the defect in this manner, the grade of the glass substrate 12 can be properly classified.

Then, by the use of, for example, a laser marker of a carbon dioxide gas laser, part of the end surface of the glass substrate 12 is melted or sublimated by irradiation of laser light to thereby form each of pits 20 of a marker 18 (marking step S110). The marker 18 represents identification information unique to the glass substrate 12. Further, this identification information is correlated with the inspection results of the substrate inspection step S108. Thus, by the use of the marker 18, it is possible to identify the shape of the glass substrate 12, such as the thickness, flatness, warp shape, and so on, and the position, kind, size, and so on of the defect. Therefore, according to this example, the formation of a mask pattern thin film 14 and so on can be efficiently carried out. Further, for example, in the manufacture of a mask, a mask pattern can be designed so as to avoid the defect.

In the marking step S110, the laser light may be irradiated a plurality of times with respect to each of the pits 20 in the marker 18. This can reduce variation in shape of the pits 20 and thus improve the reading accuracy of the marker 18.

Then, the marker 18 is read and, based on the read marker 18, a determination is made of the mask pattern thin film 14 to be formed on the glass substrate 12 (thin film determining step S112). In this example, the thin film determining step S112 identifies the surface shape of the glass substrate 12 from the inspection results of the substrate inspection step S108 correlated with the marker 18. Then, according to the identified shape such as, for example, the warp shape of the main surface, a selection is made of the type of a mask blank suitable for use of the glass substrate 12. Based on it, the thin film determining step S112 determines a light-shielding film, a light-shielding film and a phase shift film, or the like necessary for such a mask blank to be the mask pattern thin film 14 to be formed.

According to this example, the type of the mask pattern thin film 14 can be determined based on the inspection results of the substrate inspection step S108. Therefore, the glass substrate 12 can be effectively used without waste.

In this example, the thin film determining step S112 further correlates information indicative of a resist film 16 to be used in the selected mask blank 10 with the identification information of the marker 18. Thus, by the use of the marker 18, the resist film 16 to be coated on the mask pattern thin film 14 can be further identified.

Next to the thin film determining step S112, the determined mask pattern thin film 14 is formed, on the main surface of the glass substrate 12, to a thickness that can achieve the required optical properties (film forming step S114) and, then, the formed mask pattern thin film 14 is inspected (thin film inspection step S116). In this example, the thin film inspection step S116 includes a pass/fail judging step and judges whether or not the formed mask pattern thin film 14 satisfies a specification of the mask blank. When it has passed the inspection of the thin film inspection step S116 (S116: Pass), the resist film 16 is coated (formed) on the mask pattern thin film 14 (resist film forming step S118) and, then, the coated resist film 16 is inspected (resist film inspection step S120). The resist film inspection step S120 includes a pass/fail judging step and judges whether or not the coated resist film 16 satisfies a specification of the mask blank. If it passes the inspection of the resist film inspection step S120 (S120: Pass), the mask blank 10 is completed.

The thin film inspection step S116 and the resist film inspection step S120 each perform the inspection for the specification which affects pattern transfer, such as, for example, that the number of defects (pinholes or particles) of 0.2 μm or more is only several or less. The thin film inspection step S116 further inspects, for example, for the predetermined optical properties (transmittance etc.).

When it has failed in the thin film inspection step S116 (S116: Fail), the mask pattern thin film 14 is stripped from the glass substrate 12 (thin film stripping step S206). Then, the marker 18 of the glass substrate 12 is read and the thickness of the glass substrate 12 is identified from the inspection results of the substrate inspection step S108 correlated with the read marker 18 (thickness identifying step S208). If the glass substrate 12 has the thickness that enables recycling by repolishing (S210: Yes), the glass substrate 12 is repolished by a polishing amount that is determined according to the thickness identified in the thickness identifying step S208 (repolishing step S212). For example, based on the identified thickness, the repolishing step S212 classifies the glass substrate 12 into one of groups sorted by thickness and polishes the glass substrate 12 by the polishing amount that is preset for that group.

Then, after the repolishing, the method returns to the cleaning step S106 and repeats the subsequent steps. In this case, the marking step S110 forms a marker 18 for identifying the glass substrate 12 recycled by the repolishing. Further, the film forming step S114 forms a new mask pattern thin film 14 on the main surface of the glass substrate 12 polished in the repolishing step S212. According to this example, the expensive glass substrate 12 can be effectively used without waste.

The step S210 judges whether or not the glass substrate 12 can be recycled, based on whether or not the minimum thickness determined for a mask blank glass substrate remains after the glass substrate 12 is repolished by a machining amount that is minimally required for satisfying the quality. When it is judged not to be recyclable due to the insufficient thickness (S21 0: No), the glass substrate 12 is discarded.

On the other hand, when it has failed in the resist film inspection step S120 (S120: Fail), the resist film 16 is stripped from the glass substrate 12 (resist film stripping step S202) and, then, it is judged whether or not repolishing is necessary for recycling of the glass substrate 12 (S204). The step S204 judges the repolishing to be necessary when, for example, the resist film inspection cannot be passed even by recoating a resist film 16 a predetermined number of times. The step S204 may judge whether or not the repolishing is necessary, based on the inspection results of the substrate inspection step S108.

When the repolishing is judged unnecessary (S204: No), the marker 18 is read and, based on the read marker 18, a selection is made of a resist film 16 to be coated on the mask pattern thin film 14 (resist selection step S214). Then, the selected resist film 16 is coated on the mask pattern thin film 14 (resist re-forming step S216) and the method proceeds again to the resist film inspection step S120. According to this example, even when coating/formation of the resist film 16 is unsuccessful, recoating/re-formation thereof can be properly carried out. Further, since the resist film 16 to be recoated/re-formed can be reliably selected, the management of the steps can be simplified.

On the other hand, when the repolishing is judged necessary (S204: Yes), the thin film stripping step S206 and the subsequent steps are repeated. This makes it possible to recycle the glass substrate 12 that cannot be recycled only by recoating/re-forming the resist film 16.

Although omitted in the foregoing description, it is preferable that the substrate inspection step S108 further judge, for example, whether or not the glass substrate 12 satisfies the required quality. In this case, if it is judged that the required quality is not satisfied, the method, for example, proceeds to the marking step S110 where the marker 18 is formed and, then, proceeds to the thickness identifying step S208 and the subsequent steps for repolishing the glass substrate 12. This makes it possible to use the glass substrate 12 more effectively without waste. For example, in the case of a glass substrate for a mask blank for ArF excimer laser exposure, the required quality in the glass substrate 12 represents a specification relating to the glass substrate which affects pattern transfer, such as, for example, that the surface roughness is 0.2 nm or less in RMS, the flatness is 0.5 μm or less, or there is no defect of 0.2 μm or more.

Figure 4:
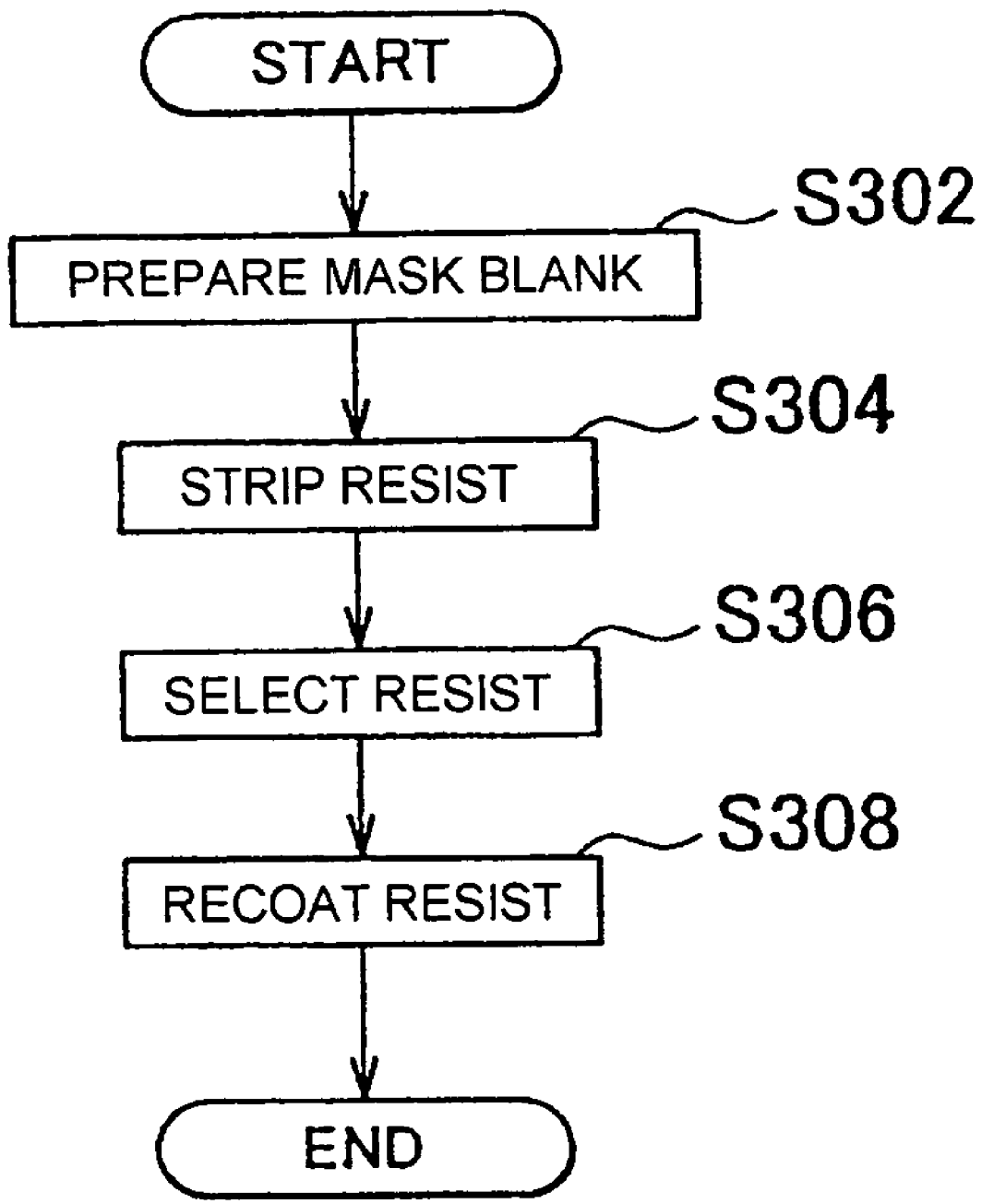
FIG. 4 is a flowchart showing one example of a manufacturing method for manufacturing a new mask blank by the use of the manufactured mask blank.

FIG. 4 is a flowchart showing one example of a manufacturing method for manufacturing a new mask blank 10 by the use of the manufactured mask blank 10. In this example, the mask blank 10 has a chemically amplified resist film formed as the resist film 16.

In this example, at first, the manufactured mask blank 10 is prepared, for example, by recovery from a mask maker (preparation step S302). For example, the preparation step S302 prepares, as the manufactured mask blank 10, a mask blank 10 after the lapse of a predetermined time (e.g. one month or more) from the coating of the resist film 16. The preparation step S302 may prepare a plurality of types of mask blanks 10 formed with different resist films 16, respectively.

Then, the resist film 16 of the mask blank 10 is stripped (resist film stripping step S304). In the resist film stripping step S304, the resist films 16 of the plurality of types of mask blanks 10 may be simultaneously stripped.

Then, the marker 18 is read and, based on the read marker 18, a selection is made of the resist film 16 that was formed in the mask blank 10 before the stripping of the resist film (resist selection step S306). Then, the selected resist film 16 is coated (formed) on the mask pattern thin film 14 (resist re-forming step S308).

Accordingly, even when the resist film 16 of the manufactured mask blank 10 is degraded or the like, the mask blank 10 can be efficiently recycled. Further, the management of the steps can be simplified by the use of the marker 18.

Example 1

100 mask blank glass substrates for ArF excimer laser exposure were manufactured according to Example 1. On an end surface of each glass substrate, a marker like that shown in FIG. 1B was formed by a laser marker using a carbon dioxide ($CO_2$) gas laser. The output of the laser marker was set to 20 mW/shot and each pit was formed by one shot. The size of the entire marker was set to 3.25 mm×3.5 mm. The steps, except the formation of the marker, were the same as those in manufacturing the known mask blank glass substrate for ArF excimer laser exposure. These glass substrates were inspected in the substrate inspection step and all of them satisfied the quality required for the mask blank glass substrate for ArF excimer laser exposure.

Comparative Example

Comparative Example was the same as Example 1 except that a YAG laser was used instead of the carbon dioxide ($CO_2$) gas laser. 100 mask blank glass substrates for ArF excimer laser exposure were manufactured according to Comparative Example. These glass substrates were inspected in the substrate inspection step and only 27% of them (i.e. 27 glass substrates) satisfied the quality required for the mask blank glass substrate for ArF excimer laser exposure.

Example 2

A marker was formed on a side surface being an end surface of each of mask blank glass substrates under the same conditions as those in Example 1. Each glass substrate had a size of 152.4 mm×152.4 mm×6.35 mm. As shown in the figure, the marker was formed to a size of 3 mm×3 mm having its center position located 7 mm away from a corner of the glass substrate where a glass notch mark was formed and 3.18 mm away from the main surface of the glass substrate. The opening width L1 of each of pits forming the marker was 170 μm, the depth D thereof was 17 μm, and thus the ratio (L1/D) between the opening width and the depth was 10. After forming the pits as the markers, the end surfaces of the glass substrates were cleaned by the use of a cleaning brush and then the defect inspection was carried out for the glass substrates. As a result, all of them satisfied the quality required for the mask blank glass substrate for ArF excimer laser exposure. Further, a mask pattern thin film was formed on each of the glass substrates and then a resist film (average thickness: 3000 Å) was formed on the mask pattern thin film by the spin coating method. Thus, mask blanks for ArF excimer laser exposure were obtained. The in-plane thickness uniformity of the resist film of each mask blank was measured. The in-plane thickness uniformity of the resist film was derived in the following manner. The thickness of the resist film was measured at (11×11=121 points) uniformly arranged over an entire guarantee area of 132 mm×132 mm (mask pattern forming area) at the center of the glass substrate by the use of a spectral reflection type thickness gauge (AFT6100M manufactured by Nanometrics Japan Ltd.) to thereby derive an in-plane thickness distribution (thickness data at the respective measurement points). From the derived in-plane thickness distribution data, the in-plane thickness uniformity was derived as "(maximum thickness value)−(minimum thickness value)=(in-plane thickness uniformity)". As a result, the in-plane thickness uniformity of each resist film was as small as 22 Å and thus was quite excellent. Further, a mask was manufactured by the use of each mask blank and the CD accuracy of the obtained mask satisfied the quality required for the mask for ArF excimer laser exposure.

While this invention has been described in terms of the preferred embodiment, the technical scope of this invention is not to be limited thereto. It is readily understood by persons skilled in the art that various modifications or improvements can be added to the foregoing embodiment. It is obvious from the recitation of claims that the modes added with those modifications or improvements can also be included in the technical scope of this invention.

This invention is suitably applicable to, for example, a mask blank glass substrate and a mask blank.

What is claimed is:

1. A method of manufacturing a glass substrate for a mask blank, comprising the steps of:
    irradiating laser light onto an area, having no influence on transfer, on a surface of the glass substrate to thereby form a pit that is used as a marker, and
    preparing substrate information about the glass substrate,
    wherein the marker includes one of identification information, an identification symbol or a managing symbol which is unique to the glass substrate, the marker being correlated with the substrate information, and
    wherein the substrate information is information including at least one of physical properties, chemical properties, optical properties, a surface form, a surface shape, a material, and a defect of the glass substrate.

2. A method of manufacturing a mask blank, comprising:
    forming a mask pattern thin film on a main surface of the glass substrate obtained by the method according to claim 1.

3. A method of manufacturing a mask blank, comprising the steps of:
    irradiating laser light onto an area, having no influence on transfer, on a surface of a glass substrate to thereby form a pit that is used as a marker,
    forming a mask pattern thin film serving as a mask pattern on a main surface of the glass substrate, and
    preparing thin film information about the mask pattern thin film after the forming of the mask pattern thin film,
    wherein the marker includes one of identification information, an identification symbol or a managing symbol which is unique to at least one of the glass substrate and the mask blank, the marker being correlated with the thin film information, and
    wherein the thin film information is information including at least one of physical properties, chemical properties, electrical properties, optical properties, a surface form, a material, a defect, and a film forming condition of the mask pattern thin film.

4. A method according to claim 3, further comprising:
    preparing substrate information about the glass substrate before the forming of the mask pattern thin film, the marker being correlated with the substrate information, and
    determining the mask pattern thin film to be formed, based on the substrate information read from the marker.

5. A method of producing a mask, comprising:
    a step of patterning the mask pattern thin film of the mask blank obtained by the method according to claim 3 to thereby form a mask pattern on the mask blank glass substrate.

6. A mask blank manufacturing method according to claim 3, further comprising:
    forming a resist film on the mask pattern thin film after the forming of the mask pattern thin film, and
    preparing step of preparing resist film information about the resist film,
    wherein the marker is correlated with the resist film information obtained in the preparing.

7. A method according to claim 6, wherein:
    the resist film information is information including at least one of physical properties, chemical properties, a surface form, a material, a defect, and a film forming condition of the resist film.

8. A method of manufacturing a mask blank for obtaining a new mask blank by using a manufactured mask blank having a mask pattern thin film on a glass substrate for the mask blank and a resist film on the mask pattern thin film,
    the glass substrate is formed in an area, having no influence on transfer, on a surface of the mask blank glass substrate, with a marker, the marker being formed by irradiation of laser light,
    wherein the marker includes identification information, an identification symbol or a managing symbol which is unique to at least one of the glass substrate and the mask blank, and
    the marker is correlated with information including at least one of substrate information about the mask blank glass substrate, thin film information about the mask pattern thin film, and resist film information about the resist film in the manufactured mask blank,
    the method comprising:
    stripping either (a) the resist film of the manufactured mask blank or (b) stripping both the resist film and the mask pattern thin film of the manufactured mask blank;
    based upon at least one of the substrate information, the thin film information, and the resist film information, either (c) re-forming a resist film other than the stripped film or (d) re-forming both a mask pattern thin film and a resist film other than the stripped films.

9. A mask blank manufacturing method according to claim 8, wherein:
    the marker has a pit shape formed by irradiating the laser light onto the area, having no influence on transfer, on the surface of the glass substrate.

10. A method according to claim 8, wherein:
    the resist film is a chemically amplified resist film, and
    a mask blank after the lapse of a predetermined time from coating of the resist film is prepared as the manufactured mask blank.

11. A mask blank manufacturing method according to claim 8, further comprising:
obtaining at least one of resist film information about the resist film and thin film information about the mask pattern thin film formed in either the (c) re-forming or the (d) re-forming,
wherein at least one of the resist film information and the thin film information is correlated with the marker.

12. A mask blank manufacturing method according to claim 8, wherein:
the substrate information is information including at least one of physical properties, chemical properties, optical properties, a surface form, a surface shape, a material, and a defect of the glass substrate.

13. A mask blank manufacturing method according to claim 8, wherein:
the thin film information is information including at least one of physical properties, chemical properties, electrical properties, optical properties, a surface form, a material, a defect, and a film forming condition of the mask pattern thin film.

14. A mask blank manufacturing method according to claim 8, wherein:
the resist film information is information including at least one of physical properties, chemical properties, a surface form, a material, a defect, and a film forming condition of the resist film.

15. A glass substrate for a mask blank, comprising:
a pit in an area, having no influence on transfer, on a surface of the glass substrate, the pit serving as a marker,
wherein the marker includes identification information, an identification symbol or a managing symbol which is unique to at least one of the glass substrate and the mask blank formed with a mask pattern thin film on the glass substrate,
wherein the marker is correlated with information including at least one of substrate information about the glass substrate, thin film information about the mask pattern thin film, and resist film information about a resist film,
wherein the substrate information is information including at least one of physical properties, chemical properties, optical properties, a surface form, a surface shape, a material, and a defect of the glass substrate, and wherein the thin film information is information including at least one of physical properties, chemical properties, electrical properties, optical properties, a surface form, a material, a defect, and a film forming condition of the mask pattern thin film.

16. A mask blank glass substrate according to claim 15, wherein:
the pit is formed in an area outside an optical path of inspection light, which checks at least a defect existing in a pattern forming area, on an end surface perpendicular to a main surface, where the mask pattern thin film is formed, of the mask blank glass substrate.

17. A mask blank glass substrate according to claim 15, wherein:
an opening width (L1) is in the range 100 μm to 500 μm,
a depth (D) of the pit is in the range 10 μm to 20 μm, and
a ratio (L1/D) between the opening width and the depth is in the range 10 to 50.

18. A mask blank, comprising:
the glass substrate according to claim 15, and a mask pattern thin film to be formed into a mask pattern, the mask pattern thin film being formed on the glass substrate.

19. A mask comprising:
the glass substrate according to claim 15; and
a mask pattern formed on the glass substrate.

20. A glass substrate for a mask blank, comprising:
a pit in an area defined by a distance of 10 mm or less from a corresponding one of four corners of the glass substrate on an end surface perpendicular to a main surface, where a mask pattern thin film to become a transfer pattern is to be formed, of the glass substrate, while excluding an area defined by a distance of 1.2 mm from edges of the main surface, the pit being formed by irradiation of laser light and used as a marker,
wherein the marker includes identification information, an identification symbol or a managing symbol which is unique to at least one of the glass substrate and the mask blank formed with a mask pattern thin film on the glass substrate,
wherein the marker is correlated with information including at least one of substrate information about the glass substrate, thin film information about the mask pattern thin film, and resist film information about a resist film,
wherein the substrate information is information including at least one of physical properties, chemical properties, optical properties, a surface form, a surface shape, a material, and a defect of the glass substrate, and
wherein the thin film information is information including at least one of physical properties, chemical properties, electrical properties, optical properties, a surface form, a material, a defect, and a film forming condition of the mask pattern thin film.

21. A glass substrate according to claim 20, wherein:
an opening width (L1) is in the range 100 μm to 500 μm,
a depth (D) of the pit is in the range 10 μm to 20 μm, and
a ratio (L1/D) between the opening width and the depth is in the range 10 to 50.

22. A mask blank, comprising:
the glass substrate according to claim 20, and
a mask pattern thin film to be formed into a mask pattern, the mask pattern thin film being formed on the glass substrate.

23. A mask comprising:
the glass substrate according to claim 20; and
a mask pattern formed on the glass substrate.

* * * * *

UNITED STATES PATENT AND TRADEMARK OFFICE
CERTIFICATE OF CORRECTION

| | | |
|---|---|---|
| PATENT NO. | : 7,851,108 B2 | Page 1 of 1 |
| APPLICATION NO. | : 11/391332 | |
| DATED | : December 14, 2010 | |
| INVENTOR(S) | : Akinori Kurikawa, Hisashi Kasahara and Yasushi Okubo | |

It is certified that error appears in the above-identified patent and that said Letters Patent is hereby corrected as shown below:

On the Title page of Item [56] U.S. Patent 7,851,108, under FOREIGN PATENT DOCUMENTS:

Please delete "JP S6241145 A   8/1994" should be -- JP S6241145 U   8/1994 --.

Signed and Sealed this
Seventeenth Day of July, 2012

David J. Kappos
*Director of the United States Patent and Trademark Office*